US006492237B2

(12) United States Patent
Kalnitsky et al.

(10) Patent No.: US 6,492,237 B2
(45) Date of Patent: Dec. 10, 2002

(54) METHOD OF FORMING AN NPN DEVICE

(75) Inventors: Alexander Kalnitsky, Portland, OR (US); Sang Hoon Park, Portland, OR (US); Robert F. Scheer, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/782,820

(22) Filed: Feb. 12, 2001

(65) Prior Publication Data

US 2002/0109208 A1 Aug. 15, 2002

(51) Int. Cl.[7] .............................................. H01L 21/331

(52) U.S. Cl. ........................ 438/309; 438/322; 438/350; 438/364; 438/202; 438/313

(58) Field of Search ................................ 438/309, 350, 438/322, 126, 127, 202, 313, 640, 370, 366, 189, 207; 257/510, 544, 655, 370, 752

(56) References Cited

U.S. PATENT DOCUMENTS 4,157,269 A * 6/1979 Ning et al. .................. 148/1.5
4,871,684 A * 10/1989 Glang et al. ................ 438/322
4,879,255 A * 11/1989 Deguchi et al. ............ 438/207
4,980,738 A * 12/1990 Welch et al. ............... 257/370
5,061,652 A * 10/1991 Bendernagel et al. ....... 438/104
5,159,429 A * 10/1992 Bendernagel et al. ....... 257/510
5,244,821 A * 9/1993 Ham et al. .................. 438/370
5,320,972 A * 6/1994 Wylie ......................... 438/366
5,340,753 A * 8/1994 Bassous ...................... 438/366
5,515,710 A * 5/1996 Boyd et al. ................. 438/309
5,804,486 A * 9/1998 Zambrano et al. .......... 438/309
5,930,635 A * 7/1999 Bashir et al. ............... 438/312
6,180,442 B1 * 1/2001 Gris ........................... 438/202
6,190,984 B1 * 2/2001 Ryum et al. ................ 438/309
6,287,930 B1 * 9/2001 Park ........................... 438/369
6,376,322 B1 * 4/2002 Gris ........................... 438/309

OTHER PUBLICATIONS

S. Wolf, Silicon Processing For The VLSI ERA, vol. 1, Lattin Press, 1986, pp. 191–194.*

* cited by examiner

*Primary Examiner*—Matthew Smith
*Assistant Examiner*—Belur V Keshavan
(74) *Attorney, Agent, or Firm*—Blakely, Sokoloff, Taylor & Zafman LLP

(57) ABSTRACT

A method of forming an NPN semiconductor device includes the steps of forming a collector region within a substrate, forming a base region over the collector region, and forming an oxide-nitride-oxide stack over the base region. Once these three structures are formed, an opening is created through the oxide-nitride-oxide stack to expose the top surface of the base region. Then, a doped polysilicon material is used to fill the opening and make electrical contact to the base region. The use of the oxide-nitride-oxide stack with appropriate etching of the opening eliminates the exposure of the base region to reactive ion etch environment typical of prior art methods for forming NPN semiconductor devices. As an option, after the opening of the oxide-nitride-oxide stack is formed, a local oxidation of silicon (LOCOS) and etched can be preformed to create oxide spacers to line the opening wall above the base region.

28 Claims, 11 Drawing Sheets

METHOD OF FORMING AN NPN DEVICE

FIELD OF THE INVENTION

This invention relates generally to semiconductor processing, and in particular, to a method of forming an NPN semiconductor device using an oxide-nitride-oxide (ONO) layers for emitter formation and another implementation using a local oxidation of silicon (LOCOS) for emitter formation.

BACKGROUND OF THE INVENTION

A typical NPN semiconductor device comprises a collector region doped with n-doping material and formed within a substrate, a base region doped with p-doping material and formed over the collector region, and an emitter region doped with p-doping material and formed over the base region. The base and collector regions are typically wider than the emitter region. Accordingly, the sub-region of the base region directly under the emitter region is typically referred to as the intrinsic base region. Whereas the sub-region of the base region not directly under the emitter region is referred to as the extrinsic base region.

The characteristics and performance of a typical NPN semiconductor device is generally sensitive to the thickness of the intrinsic and extrinsic sub-regions of the base region. For example, the thickness of the intrinsic base sub-region typically affects the speed of the NPN device. A thinner intrinsic base sub-region typically results in higher speed capability for the NPN device. Whereas, a thicker intrinsic base sub-region typically results in lower speed capability for the NPN device. Also, the thickness of the extrinsic base sub-region typically affects the base resistance of the NPN device. A thinner extrinsic base sub-region typically results in higher base resistance for the NPN device. Whereas, a thicker extrinsic base sub-region typically results in lower base resistance for the NPN device.

Existing processes open the emitter window in oxide by means of highly selective (oxide to silicon) reactive ion etches. While etch selectivity is usually very high, it is not infinite. This results in a certain amount of the non-uniform (from device to device) base silicon erosion and, consequently, in devices with variable base width and poor repeatability.

Thus, to maintain repeatability of device performance from lot to lot and within wafer, there is a need for a method of forming an NPN device which provides an improved control of the thickness of the intrinsic and extrinsic base sub-regions. In addition, there is a need for a method of forming an NPN device which results in a thinner intrinsic base sub-region to improve the speed capability of the device. Furthermore, there is a need for a method of forming an NPN device which results in a thicker extrinsic base sub-region to achieve a relatively low base resistance for the device.

Such needs and others are met with the method of forming an NPN device in accordance with the invention.

SUMMARY OF THE INVENTION

An aspect of the invention relates to a method of forming an NPN semiconductor device that provides improved control of the thickness of the intrinsic and extrinsic base sub-regions, provides a thinner intrinsic base sub-region to improve the speed capability of the device, and provides a thicker extrinsic base sub-region to achieve a relatively low base resistance for the device.

The method of forming an NPN semiconductor device of the invention comprises forming a collector region within a substrate, forming a base region over the collector region, and forming an oxide-nitride-oxide stack over the base region. Once these three structures are formed, an opening is created through the oxide-nitride-oxide stack to expose the top surface of the base region. Then, a doped polysilicon material is used to fill the opening and make electrical contact to the base region. The use of the oxide-nitride-oxide stack with appropriate process to etch the opening eliminates the exposure of the base region to reactive ion etch environment typical of prior art methods for forming NPN semiconductor devices.

In the exemplary implementation of the method of forming an NPN semiconductor device, the forming of the oxide-nitride-oxide stack comprises thermally growing or depositing a 30 to 300 Angstrom layer of silicon dioxide ($SiO_2$) over the base region, then depositing a 200 to 1000 Angstrom layer of silicon nitride ($Si_3N_4$) using either low pressure chemical vapor deposition (LPCVD), atmospheric pressure chemical vapor deposition (APCVD), or plasma enhanced chemical vapor deposition (PECVD), and depositing a 1000 to 5000 Angstrom layer of silicon dioxide ($SiO_2$) by chemical vapor deposition.

The forming of the opening through the oxide-nitride-oxide stack comprises depositing a coat of photo resist over the oxide-nitride-oxide stack and forming a window through which etching is to take place. Then, the etching of the upper oxide layer is performed using an etching process that is highly selective to nitride. This is followed by etching of the nitride layer using an etching process that is highly selective to oxide. Finally, the etching of the lower oxide layer is performed using an etching process that is highly selective to silicon. Once the opening is formed, an in-situ doped or non-doped polysilicon material is deposited to fill the opening. The non-doped polysilicon is then doped to achieve a desired conductivity.

Another aspect of the invention is a variation of the above method of forming an NPN semiconductor device. This variation uses the same initial steps of the method described above, namely forming a collector region, forming a base region over the collector region, forming an oxide-nitride-oxide stack over the base region, and forming an opening through the oxide-nitride-oxide stack to expose the top surface of the base region. Once this is done, a local oxidation of silicon (LOCOS) is performed on the base region to form a silicon dioxide layer at the bottom of the opening. Then a central portion of the silicon dioxide layer is etched away to form oxide spacers on the side of the openings at the top surface of the base region. Then, polysilicon material is deposited to fill the opening and doped to achieve a desired conductivity.

Other aspects, features and techniques of the invention will become apparent to one skilled in the relevant art in view of the following detailed description of the invention.

DETAILED DESCRIPTION OF THE INVENTION

Figure 1A:
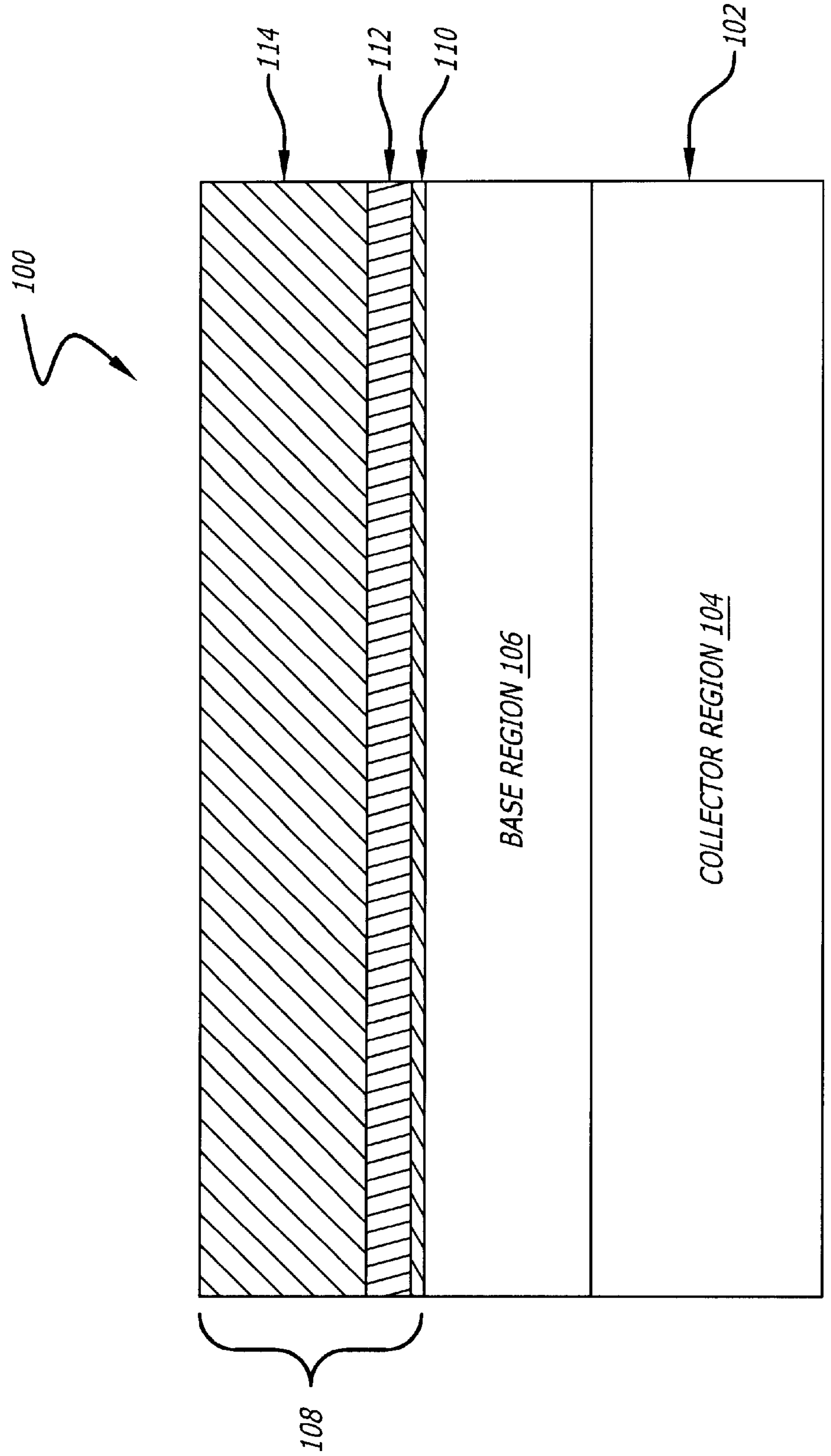
FIG. 1A illustrates a cross-sectional view of an exemplary semiconductor device at an intermediate step of forming an NPN device in accordance with the invention.

FIG. 1A illustrates a cross-sectional view of an exemplary semiconductor device 100 at an intermediate step of forming an NPN device in accordance with the invention. At this intermediate step, the semiconductor device 100 comprises a substrate 102 having a collector region 104, a base region 106 formed over the collector region 104, and an oxide-nitride-oxide (ONO) stack 108 formed over the base region 106.

In the exemplary embodiment, the collector region 104 is formed by masking the top surface of the substrate 102 to define the collector region, heavily doping the substrate 102 with n-doping material (e.g. phosphorous or arsenic) to form a diffused n-doped region, and then forming a lighter n-doped epitaxial layer above the heavily doped diffused region. Also in the exemplary embodiment, the base region 106 may be formed of silicon or silicon-germanium or silicon-germanium-carbon, and is epitaxially grown and doped with p-doping material (e.g. boron).

In the exemplary embodiment, the oxide-nitride-oxide (ONO) stack 108 comprises a lower silicon dioxide ($SiO_2$) layer 110 formed over the base region 106, a silicon nitride ($Si_3N_4$) layer 112 formed over the silicon dioxide ($SiO_2$) layer 110, and an upper silicon dioxide ($SiO_2$) layer 114 formed over the silicon nitride ($Si_3N_4$) layer 112. The lower silicon dioxide ($SiO_2$) layer 110 may be grown or deposited, and is thereafter annealed. The thickness for the lower silicon dioxide ($SiO_2$) layer 110 may be approximately 30 to 200 Angstroms. The silicon nitride ($Si_3N_4$) layer 112 may be deposited by low pressure chemical vapor deposition (LPCVD) or atmospheric pressure chemical vapor deposition (APCVD) or plasma enhanced chemical vapor deposition (PECVD). The thickness for the silicon nitride ($Si_3N_4$) layer 112 may be approximately 50 to 1000 Angstroms. The upper silicon dioxide ($SiO_2$) layer 114 is deposited by chemical vapor deposition (CVD) or plasma-enhanced Chemical Vapor Deposition (PECVD), and may have a thickness of approximately 1000 to 5000 Angstroms.

Figure 1B:
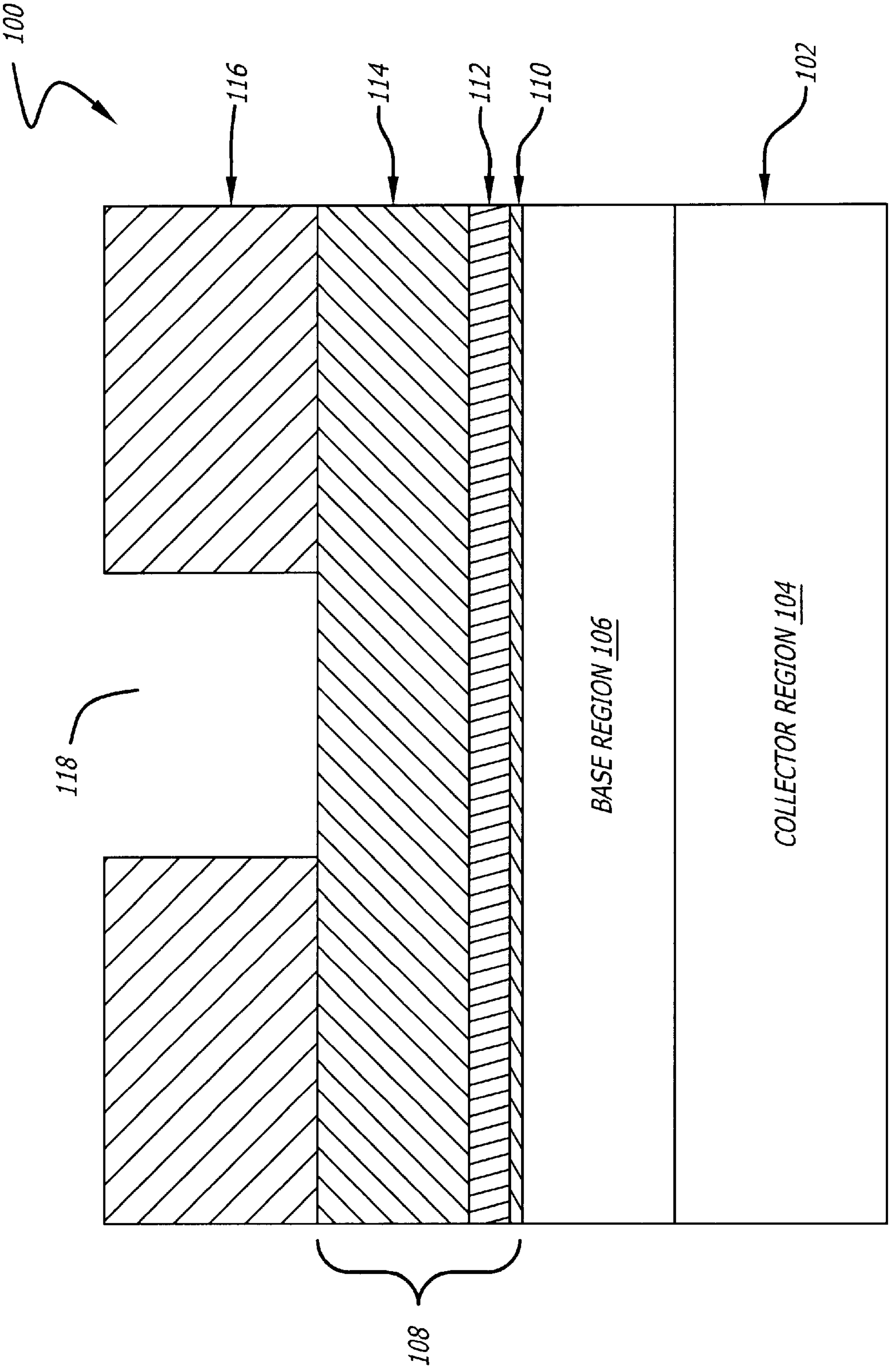
FIG. 1B illustrates a cross-sectional view of an exemplary semiconductor device at a subsequent step of forming an NPN device in accordance with the invention.

FIG. 1B illustrates a cross-sectional view of the exemplary semiconductor device 100 at a subsequent step of forming an NPN device in accordance with the invention. In this subsequent step, a layer of photo resist 116 is formed over the upper silicon dioxide ($SiO_2$) layer 114 of the oxide-nitride-oxide (ONO) stack 108, and patterned to form a window 118 through which etching of the oxide-nitride-oxide (ONO) stack 108 will take place. The window 118 defines the intrinsic emitter, base and collector regions of the NPN device.

Figure 1C:
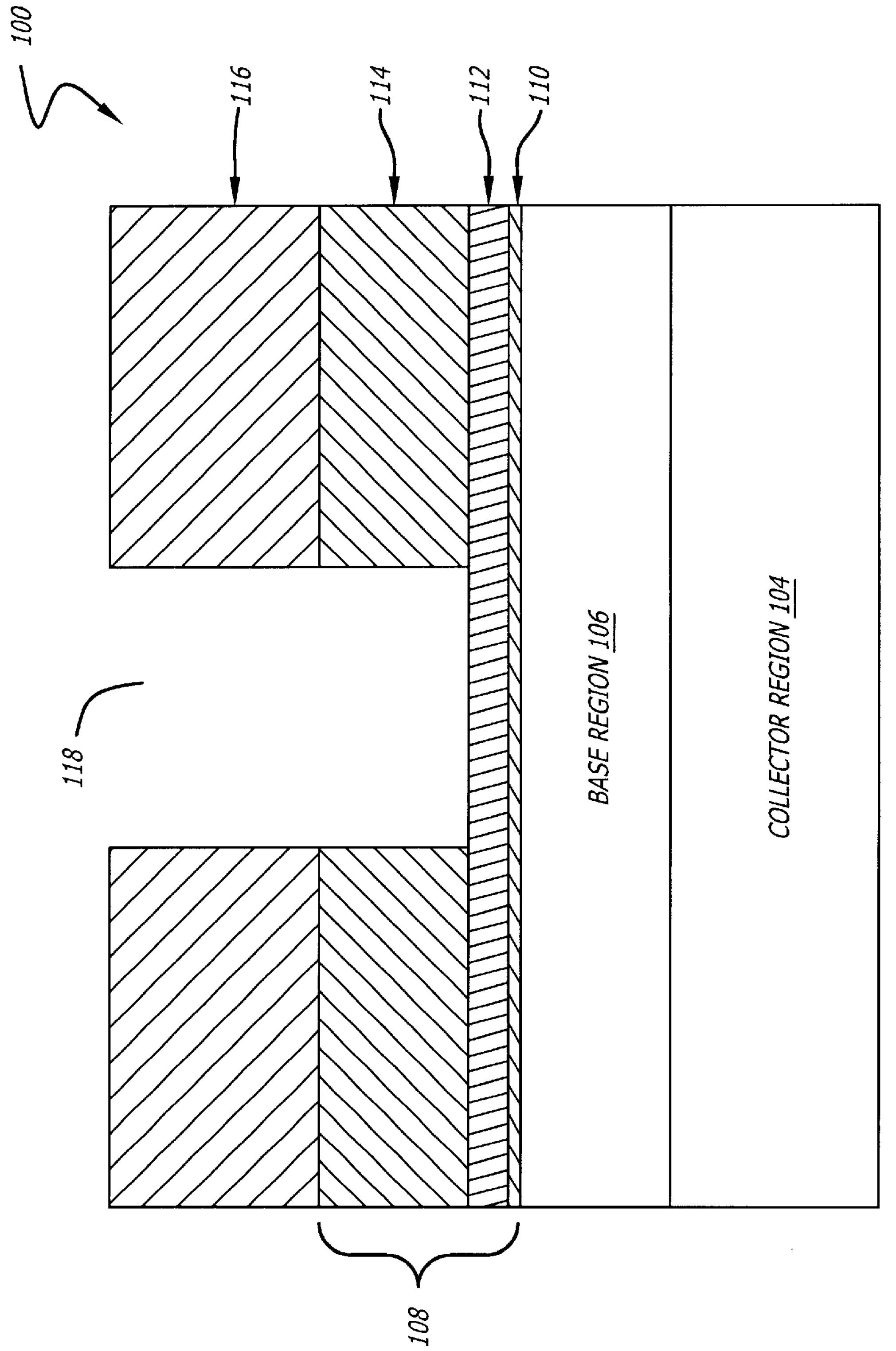
FIG. 1C illustrates a cross-sectional view of an exemplary semiconductor device at another subsequent step of forming an NPN device in accordance with the invention.

FIG. 1C illustrates a cross-sectional view of the exemplary semiconductor device 100 at another subsequent step of forming an NPN device in accordance with the invention. In this subsequent step, the upper silicon dioxide ($SiO_2$) layer 114 of the oxide-nitride-oxide (ONO) stack 108 is etched underneath of the window 118 of the photo resist 116 to expose the top surface of the silicon nitride ($Si_3N_4$) layer 112. The etching of the upper silicon dioxide ($SiO_2$) layer 114 is highly selective to nitride so as to minimize the etching of the underlying silicon nitride ($Si_3N_4$) layer 112.

Figure 1D:
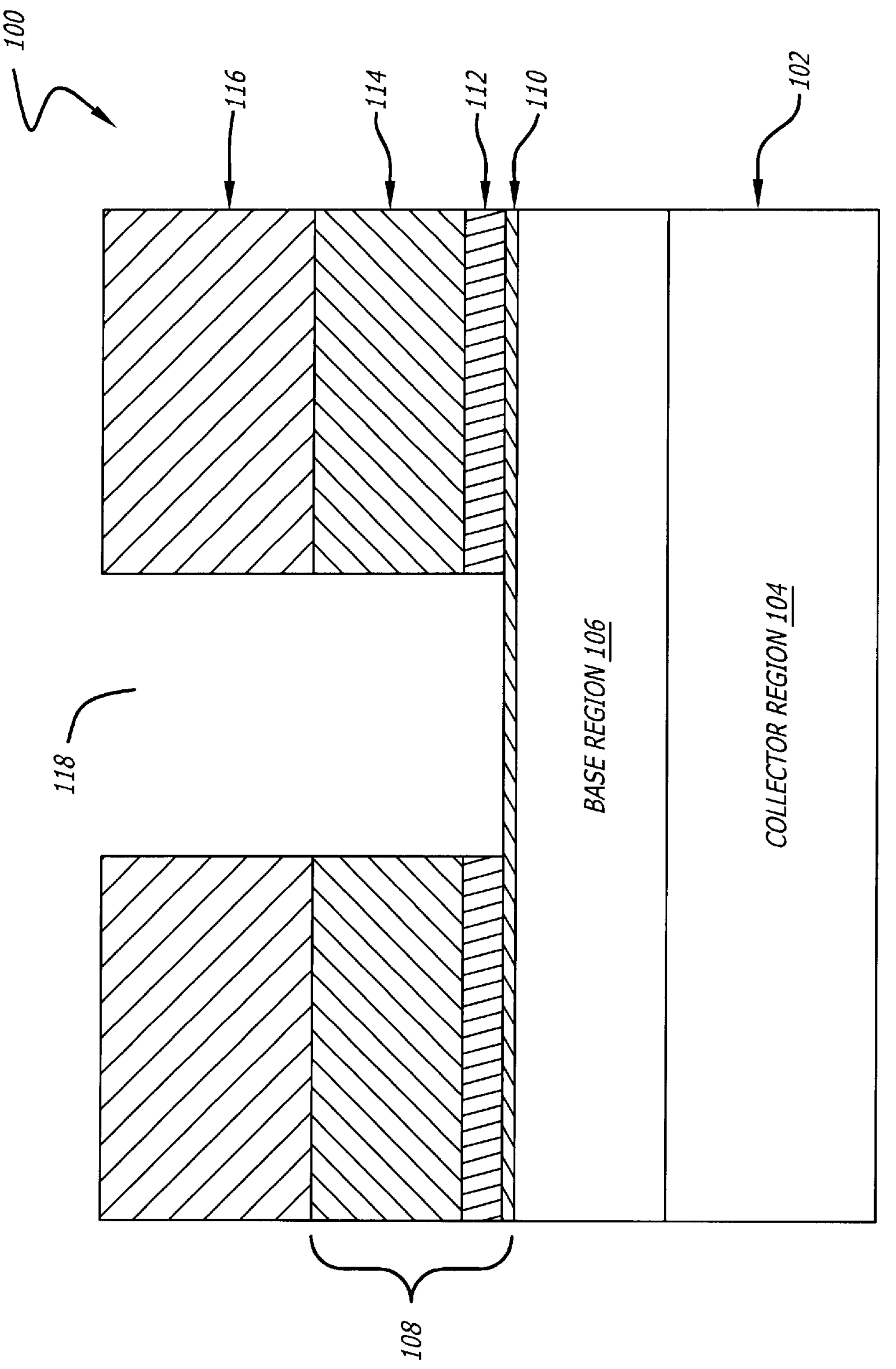
FIG. 1D illustrates a cross-sectional view of an exemplary semiconductor device at another subsequent step of forming an NPN device in accordance with the invention.

FIG. 1D illustrates a cross-sectional view of the exemplary semiconductor device 100 at another subsequent step of forming an NPN device in accordance with the invention. In this subsequent step, the silicon nitride ($Si_3N_4$) layer 112 of the oxide-nitride-oxide (ONO) stack 108 is etched underneath of the window 118 of the photo resist 116 to expose the top surface of the lower silicon dioxide ($SiO_2$) layer 110. The etching of the silicon nitride ($Si_3N_4$) layer 112 is highly selective to oxide so as to minimize the etching of the remaining upper silicon dioxide layer 114 and the underlying lower silicon dioxide ($SiO_2$) layer 110. In addition, at this stage the semiconductor device 100 can be optionally subjected to an ion implantation process to implant n-dopant ions into the collector region 104 through the window 1 18 of the photo resist 116. This is done to increase the electric fields generated in the collector region during operation of the device, and/or to decrease the series resistance of the device. Since the ion implantation occurs through the emitter opening, the further doping of the collector region 104 is self-aligned with the emitter region.

Figure 1E:
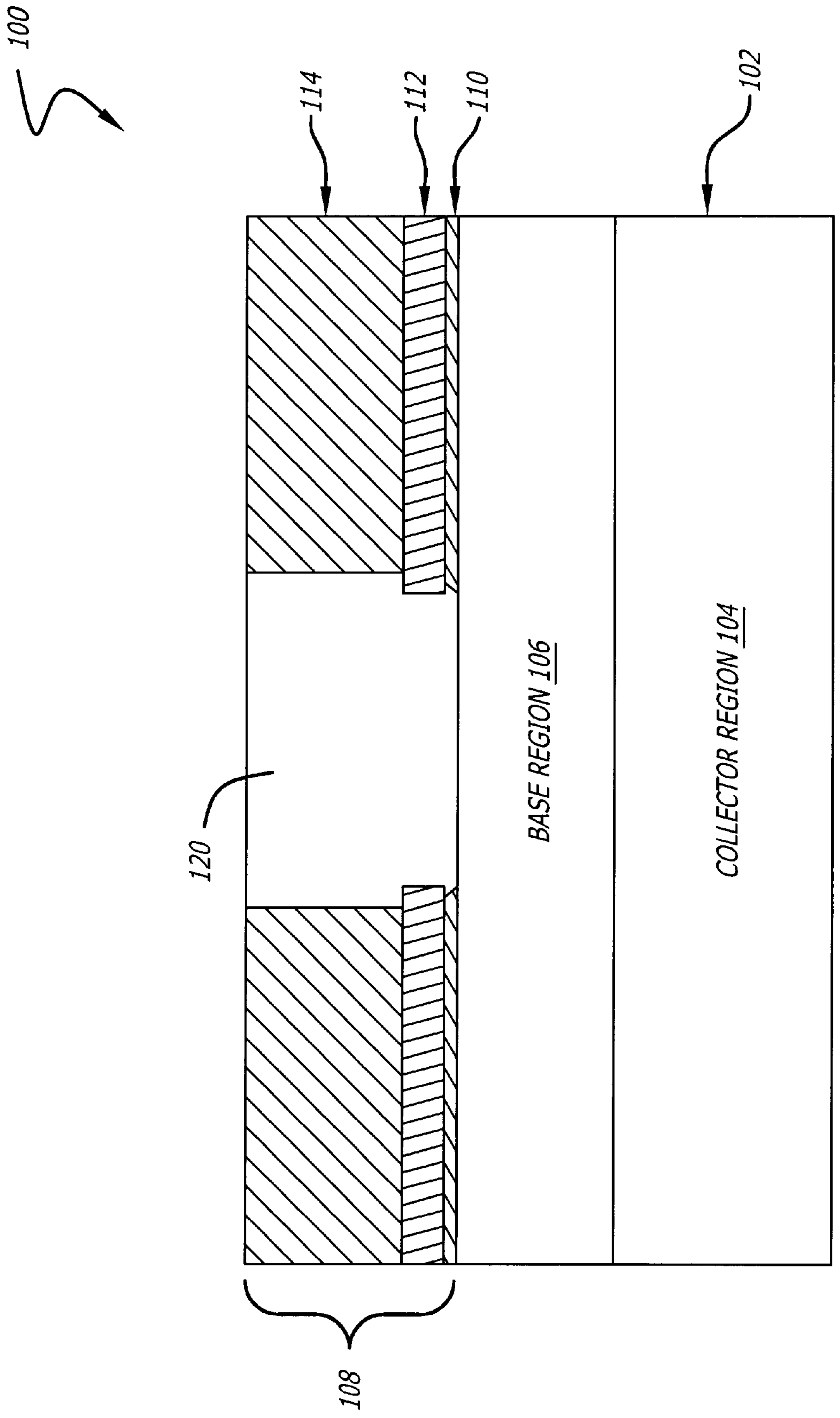
FIG. 1E illustrates a cross-sectional view of an exemplary semiconductor device at another subsequent step of forming an NPN device in accordance with the invention.

FIG. 1E illustrates a cross-sectional view of the exemplary semiconductor device 100 at another subsequent step of forming an NPN device in accordance with the invention. In this subsequent step, the photo resist 116 is removed, and then the semiconductor device 100 undergoes another etching process to remove the lower silicon dioxide ($SiO_2$) layer 110 underlying the emitter opening 120 through the upper silicon dioxide ($SiO_2$) layer 114 and the silicon nitride ($Si_3N_4$) layer 112. In the exemplary method, a wet etching process using hydrofluoric (HF) acid is used to remove the lower silicon dioxide ($SiO_2$) layer 110. This etching process may result in some undercutting of the lower silicon dioxide ($SiO_2$) layer 110 below the silicon nitride ($Si_3N_4$) layer 112. In addition, this etching process may widen the emitter opening 120 at the upper silicon dioxide ($SiO_2$) layer 114. An advantage of using hydrofluoric (HF) acid to etch the lower silicon dioxide ($SiO_2$) layer 110 is that it does not substantially affect the underlying base region 106, and thus the thickness of the intrinsic sub-region of the base region 106 is well controlled. The increased size of the emitter opening in the upper oxide layer 114 helps reduce the emitter resistance, especially in technologies utilizing the non-doped polysilicon emitter fill and subsequent doping by ion implantation.

Figure 1F:
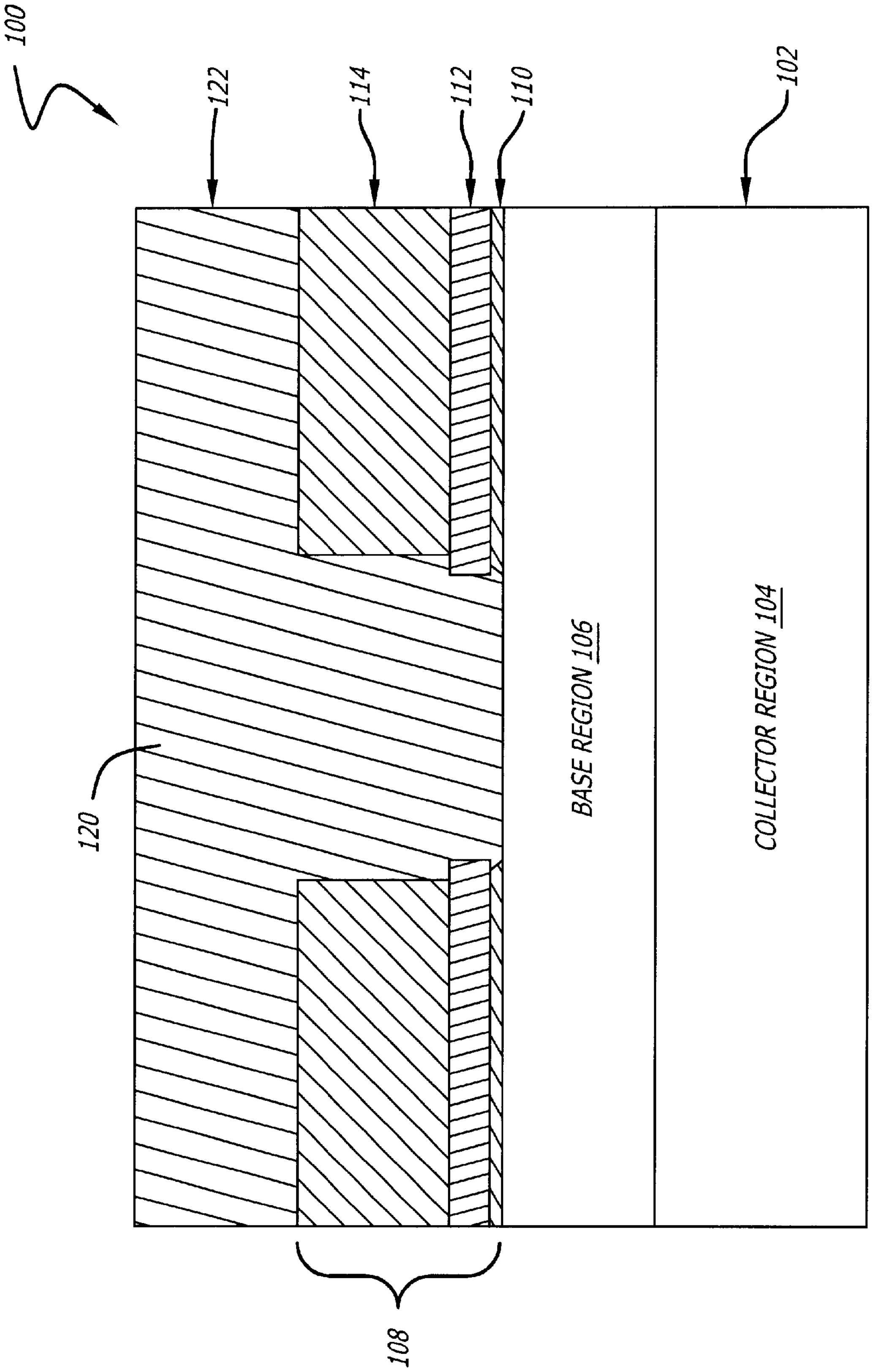
FIG. 1F illustrates a cross-sectional view of an exemplary semiconductor device at another subsequent step of forming an NPN device in accordance with the invention.

FIG. 1F illustrates a cross-sectional view of an exemplary semiconductor device 100 at another subsequent step of forming an NPN device in accordance with the invention. In this subsequent step, a layer of polycrystalline silicon ("polysilicon") 122 is deposited over the semiconductor 100, and specifically to fill the emitter openings 120 of the oxide-nitride-oxide (ONO) stack 108 to make electrical contact with the base region 106, and over the upper silicon dioxide ($SiO_2$) layer 114. The polysilicon 122 is either deposited in-situ doped or non-doped and then doped to achieve a desired conductivity.

Figure 1G:
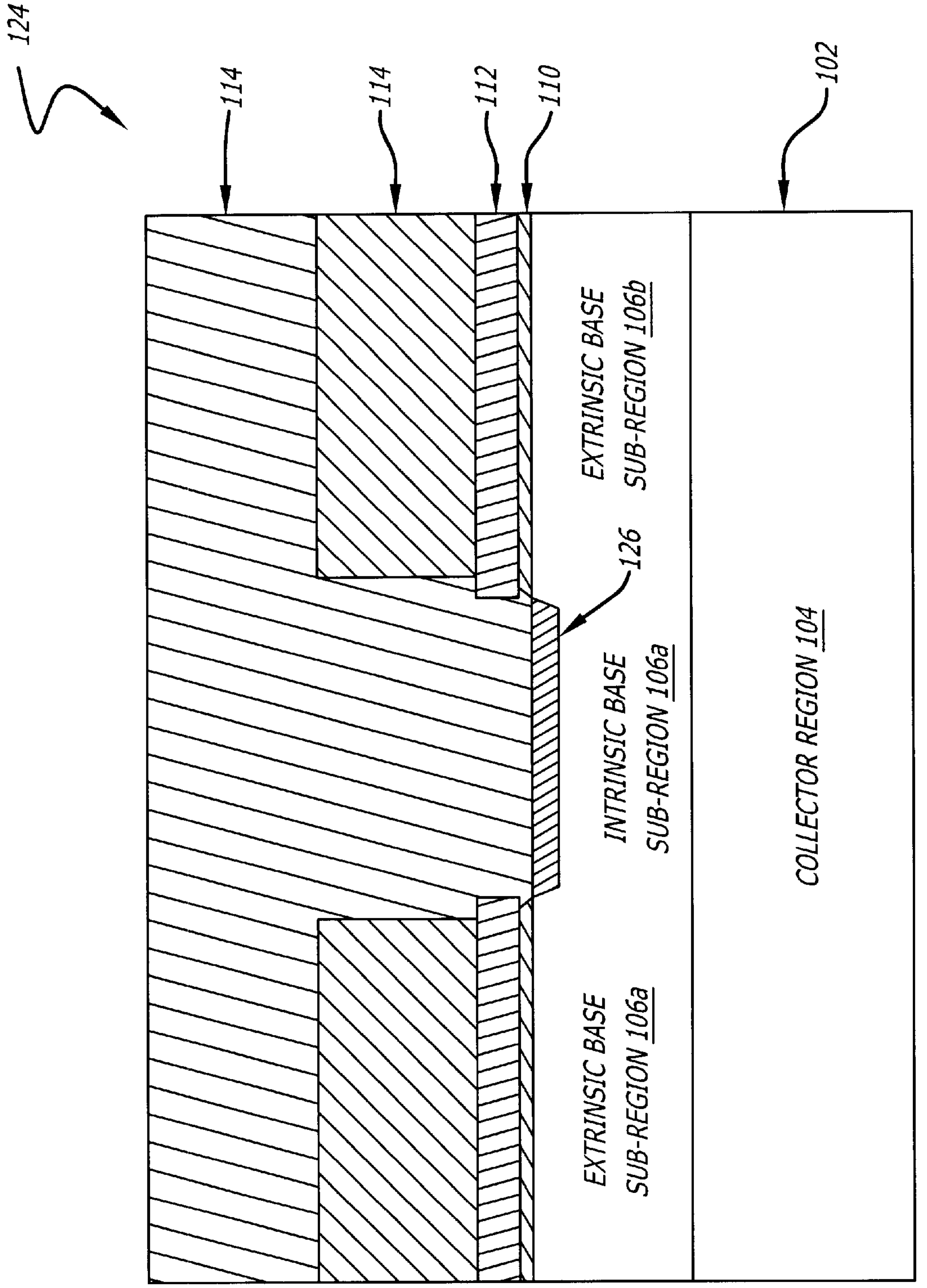
FIG. 1G illustrates a cross-sectional view of the exemplary NPN device resulting from the processing steps described with regard to FIGS. 1A–1F.

FIG. 1G illustrates a cross-sectional view of the exemplary NPN device 124 resulting from the processing steps described above. After doping the polysilicon 114, the dopants diffused into the base region 106 and forms an emitter diffusion region 126. The emitter diffusion region 126 thereby reduces the thickness of the base region 106 below the emitter diffusion region 126. The sub-region of the base region 106 below the emitter diffusion region 126 is termed herein as the intrinsic base sub-region 106*a*. The sub-region of the base region 106 not below the emitter diffusion region 126 is termed herein as the extrinsic base sub-region 106*b*.

Figure 2A:
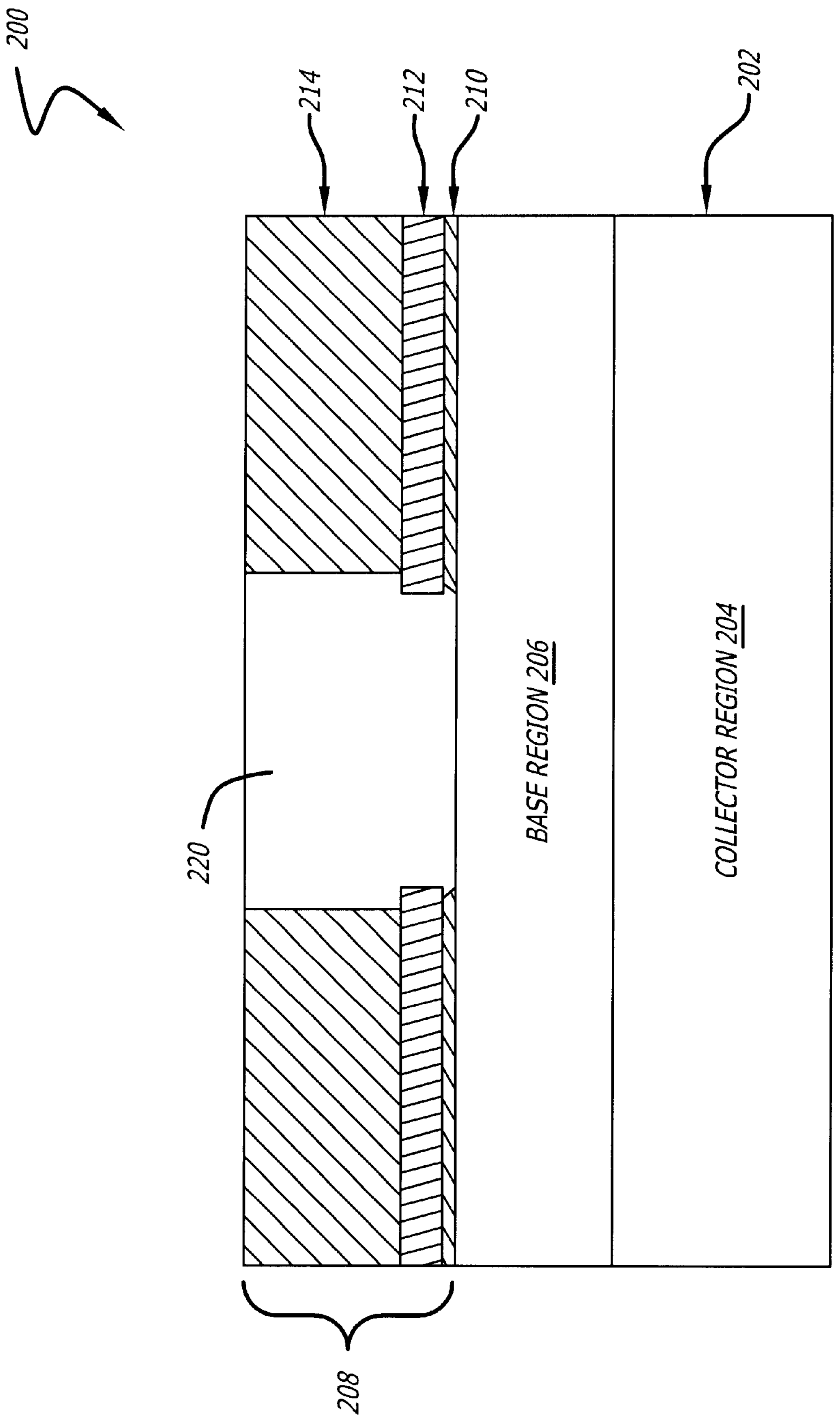
FIG. 2A illustrates a cross-sectional view of an exemplary semiconductor device at an intermediate step of another method forming an NPN device in accordance with the invention.

FIG. 2A illustrates a cross-sectional view of another exemplary semiconductor device 200 at an intermediate step of another method of forming an NPN device in accordance with the invention. At this intermediate step, the semiconductor device 200 has undergone the same steps as exemplary device 100 as described with reference to FIGS. 1A–1E. Thus, at this step, the semiconductor device 200 comprises a substrate 202 having a collector region 204, a base region 206 formed over the collector region 204, and an oxide-nitride-oxide (ONO) stack 208 having an emitter opening 220. The oxide-nitride-oxide (ONO) stack 208, in turn, comprises a lower silicon dioxide ($SiO_2$) layer 210 formed over the base region 206, a silicon nitride ($Si_3N_4$) layer 212 formed over the silicon dioxide ($SiO_2$) layer 210, and an upper silicon dioxide ($SiO_2$) layer 214 formed over the silicon nitride ($Si_3N_4$) layer 212.

Figure 2B:
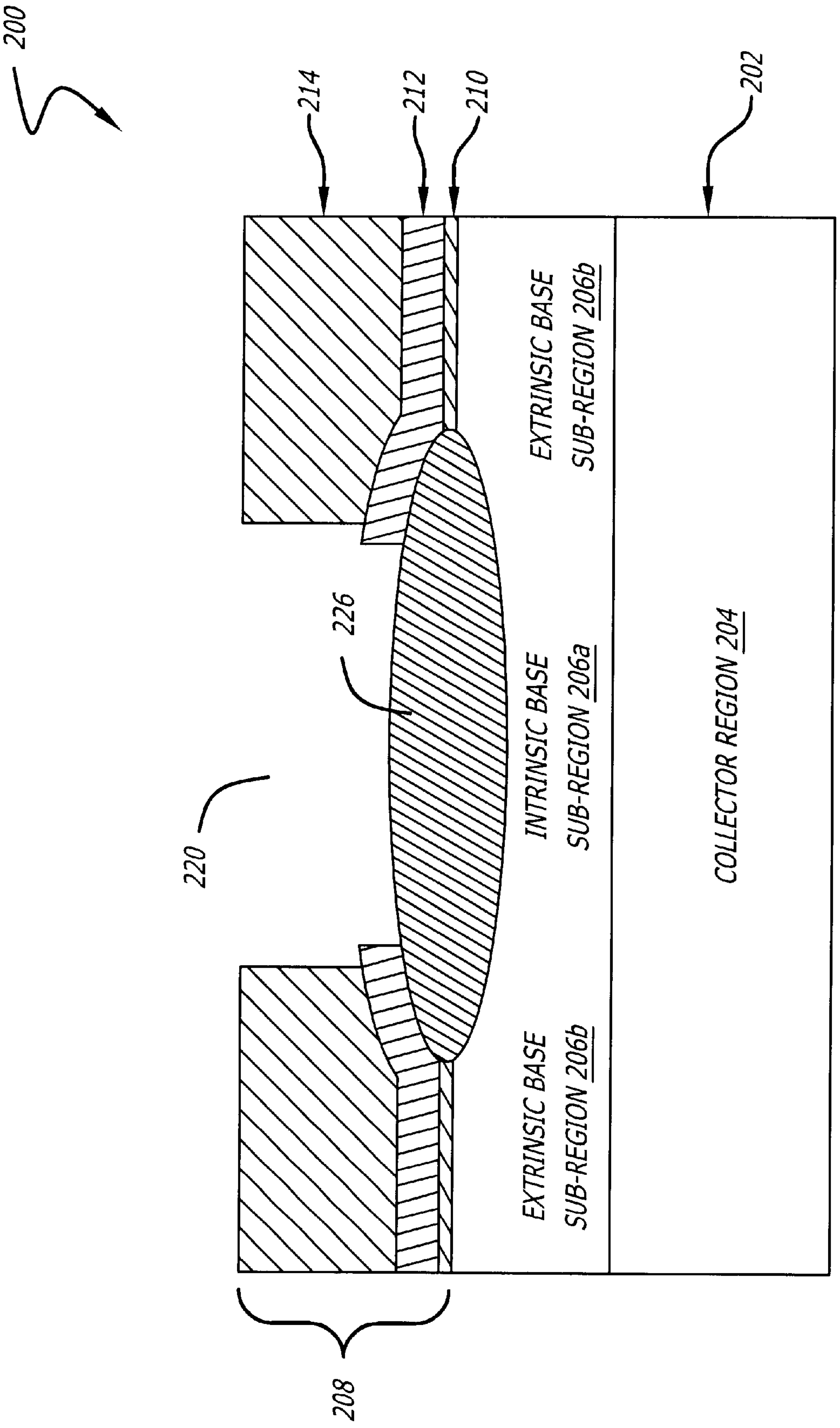
FIG. 2B illustrates a cross-sectional view of the exemplary semiconductor device at a subsequent step of the other method forming an NPN device in accordance with the invention.

FIG. 2B illustrates a cross-sectional view of the exemplary semiconductor device 200 at a subsequent step of the other method of forming an NPN device in accordance with the invention. In this subsequent step, the base region 206 below the emitter opening 220 is subjected to a local oxidation of silicon (LOCOS). This region forms a layer of silicon dioxide 226 above the intrinsic base sub-region 206*a*. The local oxidation of silicon (LOCOS) can be performed by low temperature steam oxidation, low temperature high pressure steam oxidation or rapid thermal oxidation with relatively high temperature steam. The thickness of the silicon oxide layer 226 may be approximately 75 to 400 Angstroms. This process reduces the thickness of the intrinsic base sub-region 206*a* so as to improve the speed of the device. However, it does not significantly affect the thickness of the extrinsic base region 206*b* allowing it to be relatively thick to give the device lower base resistance.

Figure 2C:
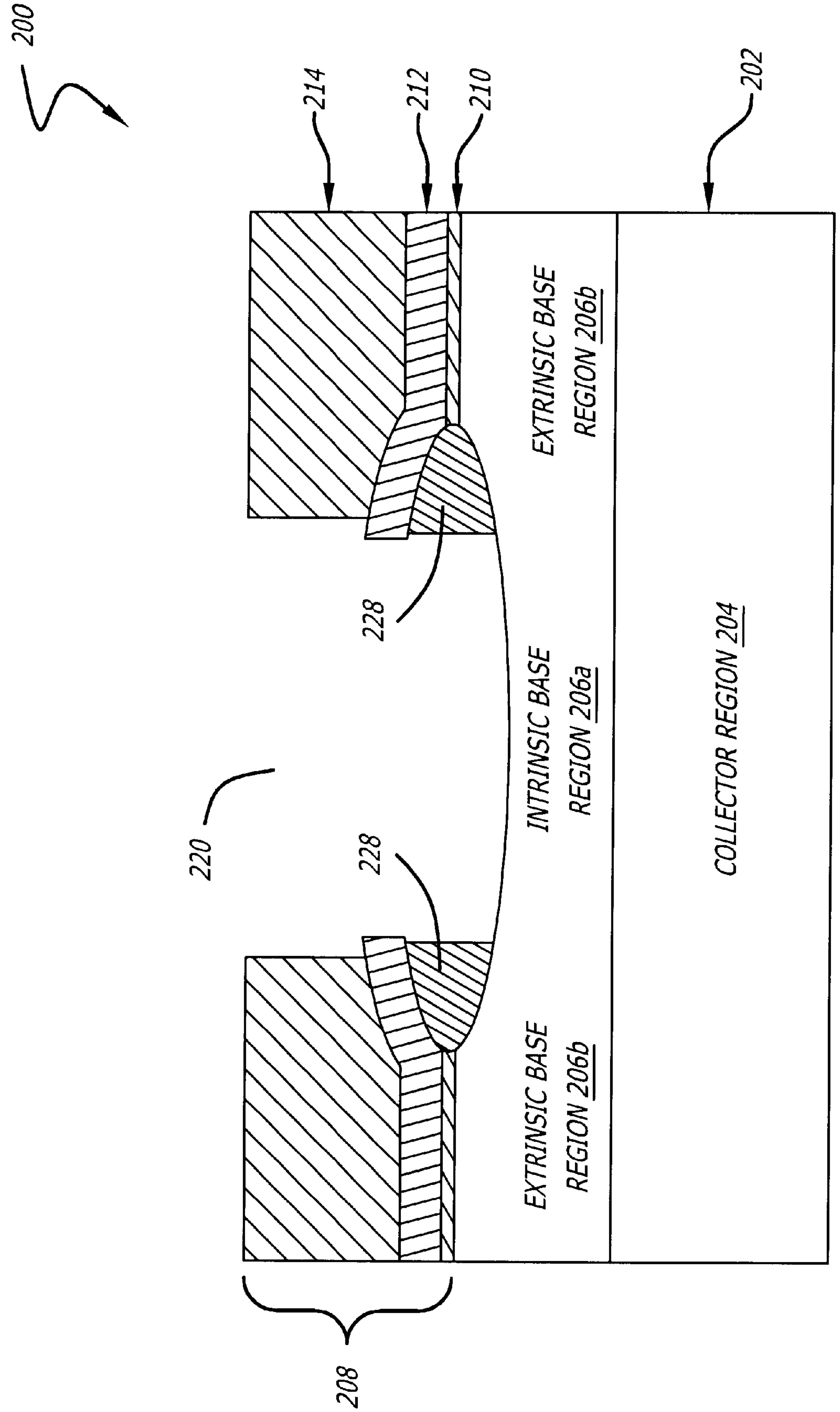
FIG. 2C illustrates a cross-sectional view of the exemplary semiconductor device at another subsequent step of the other method forming an NPN device in accordance with the invention.

FIG. 2C illustrates a cross-sectional view of the exemplary semiconductor device 200 at another subsequent step of the other method of forming an NPN device in accordance with the invention. In this subsequent step, the silicon dioxide layer 226 is etched to expose the top surface of the intrinsic base sub-region 206*a*. The etching process can be highly selective to nitride to substantially preserve the original size of the emitter opening 220. The etching of the silicon dioxide layer 226 forms silicon dioxide spacers 228 above and on opposite sides of the intrinsic base region 206*a*.

Figure 2D:
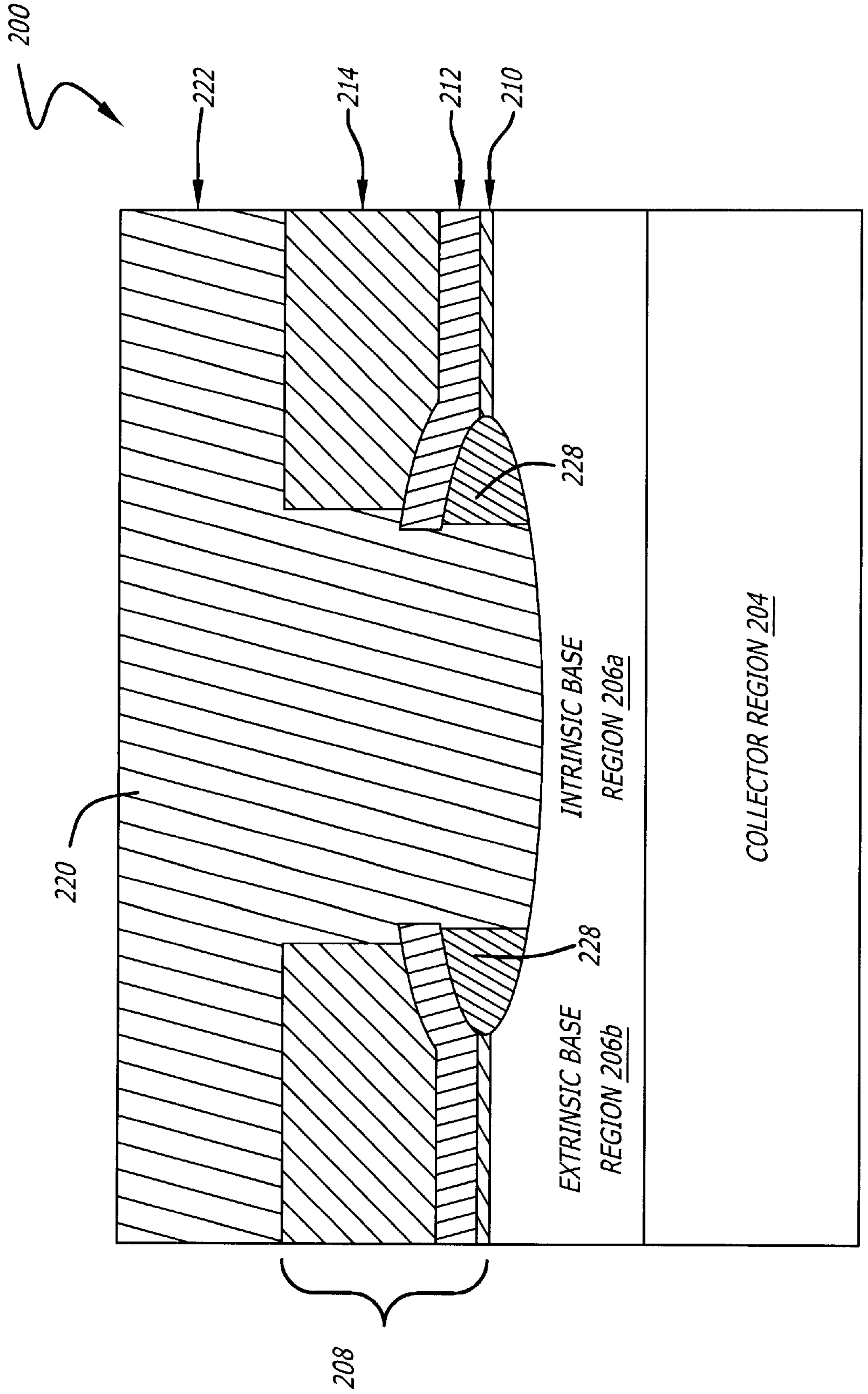
FIG. 2D illustrates a cross-sectional view of the exemplary semiconductor device at another subsequent step of the other method forming an NPN device in accordance with the invention.

FIG. 2D illustrates a cross-sectional view of the exemplary semiconductor device 200 at another subsequent step of the second method of forming an NPN device in accordance with the invention. In this subsequent step, the semiconductor device 200 is undergone a pre-poly cleaning process by briefly subjecting the device to hydrofluoric (HF) acid. Then, a layer of polycrystalline silicon ("polysilicon") 222 is deposited over the semiconductor 200, and specifically within the emitter opening 220 of the oxide-nitride-oxide (ONO) stack 208 to make electrical contact with the base region 206 and over the upper silicon dioxide ($SiO_2$) layer 214. The polysilicon 122 is either deposited in-situ doped or non-doped and is then doped to achieve a desired conductivity.

Thus, FIG. 2D illustrate a cross-section of the NPN device in accordance with the invention. As previously discussed, the thinner intrinsic base sub-region 206*a* gives the device higher speed capability. Also, the thicker extrinsic base sub-region 206*b* gives the device lower base resistance. In addition, the silicon dioxide spacers 228 can reduce the emitter capacitance as well.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A method of forming a semiconductor device, comprising:

forming a collector region within a substrate;

forming a base region over said collector region;

forming an oxide-nitride-oxide stack over said base region;

forming an opening through said oxide-nitride-oxide stack to expose an intrinsic sub-region of said base region; and forming doped polysilicon over said oxide-nitride-oxide stack and continuously within said opening to make electrical contact with said intrinsic sub-region of said base region.

2. The method of claim 1, wherein said base region comprises silicon.

3. The method of claim 1, wherein said base region comprises silicon-germanium or silicon-germanium-carbon.

4. The method of claim 1, wherein forming said oxide-nitride-oxide stack comprises:

forming a first silicon dioxide layer over said base region;

forming a silicon nitride layer over said first silicon dioxide layer; and forming a second silicon dioxide layer over said silicon nitride layer.

5. The method of claim 4, wherein forming said first silicon dioxide layer comprises thermally growing said first silicon dioxide layer.

6. The method of claim 5, further comprising annealing said first silicon dioxide layer.

7. The method of claim 4, wherein a thickness of said first silicon dioxide layer is approximately 30 to 200 Angstroms.

8. The method of claim 4, wherein forming said silicon nitride layer comprises depositing said silicon nitride layer by low pressure chemical vapor deposition (LPCVD).

9. The method of claim 4, wherein forming said silicon nitride layer comprises depositing said silicon nitride layer by atmospheric pressure chemical vapor deposition (APCVD).

10. The method of claim 4, wherein forming said silicon nitride layer comprises depositing said silicon nitride layer by plasma enhanced chemical vapor deposition (PECVD).

11. The method of claim 4, wherein a thickness of said silicon nitride layer is approximately 200 to 1000 Angstroms.

12. The method of claim 4, wherein forming said second silicon dioxide layer comprises depositing said second silicon dioxide layer by chemical vapor deposition or PECVD.

13. The method of claim 4, wherein a thickness of said second silicon dioxide layer is approximately 1000 to 5000 Angstroms.

14. The method of claim 4, wherein forming said opening through said oxide-nitride-oxide stack comprises:

forming a photo resist layer over said second silicon dioxide layer;

forming a window through said photo resist layer;

etching said second silicon dioxide layer through said window using a first etching process that substantially does not affect said silicon nitride layer;

etching said silicon nitride layer through said window using a second etching process that substantially does not affect said first silicon dioxide layer; and removing said first silicon dioxide layer to expose said intrinsic sub-region of said base region.

15. A method of forming a semiconductor device, comprising:

forming a collector region within a substrate;

forming a base region over said collector region;

forming an oxide-nitride-oxide stack over said base region;

forming an opening through said oxide-nitride-oxide stack to expose an intrinsic sub-region of said base region;

forming a local oxidation of silicon layer on said intrinsic sub-region of said base region;

etching a portion of said local oxidation of silicon layer through said opening to expose said intrinsic sub-region of said base region; and forming doped polysilicon within said opening to make electrical contact with said intrinsic sub-region of said base region.

16. The method of claim 15, wherein said base region comprises silicon-germanium or silicon-germanium-carbon.

17. The method of claim 15, wherein forming said oxide-nitride-oxide stack comprises:

forming a first silicon dioxide layer over said base region;

forming a silicon nitride layer over said first silicon dioxide layer; and forming a second silicon dioxide layer over said silicon nitride layer.

18. The method of claim 17, wherein forming said first silicon dioxide layer comprises thermally growing said first silicon dioxide layer.

19. The method of claim 17, further comprising annealing said first silicon dioxide layer.

20. The method of claim 17, wherein a thickness of said first silicon dioxide layer is approximately 30 to 200 Angstroms.

21. The method of claim 17, wherein forming said silicon nitride layer comprises depositing said silicon nitride layer by low pressure chemical vapor deposition (LPCVD).

22. The method of claim 17, wherein forming said silicon nitride layer comprises depositing said silicon nitride layer by atmospheric pressure chemical vapor deposition (APCVD).

23. The method of claim 17, wherein forming said silicon nitride layer comprises depositing said silicon nitride layer by plasma enhanced chemical vapor deposition (PECVD).

24. The method of claim 17, wherein a thickness of said silicon nitrate layer is approximately 200 to 1000 Angstroms.

25. The method of claim 17, wherein forming said second silicon dioxide layer comprises depositing said second silicon dioxide layer by chemical vapor deposition.

26. The method of claim 17, wherein a thickness of said second silicon dioxide layer is approximately 1000 to 5000 Angstroms.

27. The method of claim 17, wherein forming said opening through said oxide-nitride-oxide stack comprises:

forming a photo resist layer over said second silicon dioxide layer;

forming a window through said photo resist layer;

etching said second silicon dioxide layer through said window using a first etching process that substantially does not affect said silicon nitride layer;

etching said silicon nitride layer through said window using a second etching process that substantially does not affect said first silicon dioxide layer; and removing said first silicon dioxide layer to expose said intrinsic sub-region of said base region.

28. The method of claim 15, wherein a thickness of said local oxidation of silicon layer is approximately 75 to 400 Angstroms.

* * * * *